(12) United States Patent
Then et al.

(10) Patent No.: US 10,879,346 B2
(45) Date of Patent: Dec. 29, 2020

(54) CAPACITOR INCLUDING MULTILAYER DIELECTRIC STACK

(71) Applicant: INTEL CORPORATION, Santa Clara, CA (US)

(72) Inventors: Han Wui Then, Portland, OR (US); Sansaptak Dasgupta, Hillsborough, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 41 days.

(21) Appl. No.: 16/303,821

(22) PCT Filed: Jul. 1, 2016

(86) PCT No.: PCT/US2016/040684
§ 371 (c)(1),
(2) Date: Nov. 21, 2018

(87) PCT Pub. No.: WO2018/004651
PCT Pub. Date: Jan. 4, 2018

(65) Prior Publication Data
US 2020/0119138 A1    Apr. 16, 2020

(51) Int. Cl.
*H01L 23/522* (2006.01)
*H01L 49/02* (2006.01)

(52) U.S. Cl.
CPC .......... *H01L 28/91* (2013.01); *H01L 23/5223* (2013.01); *H01L 28/65* (2013.01)

(58) Field of Classification Search
CPC ...... H01L 28/91; H01L 23/5223; H01L 28/65
See application file for complete search history.

(56) References Cited

U.S. PATENT DOCUMENTS 5,102,820 A * 4/1992 Chiba ............... H01L 27/10817
257/306
8,349,696 B1 * 1/2013 Chen ....................... H01L 28/65
438/393
(Continued)

FOREIGN PATENT DOCUMENTS

WO    2018004651 A1    1/2018

OTHER PUBLICATIONS

International Search Report and Written Opinion received for PCT Application No. PCT/US2016/040684, dated Mar. 29, 2017. 13 pages.

(Continued)

*Primary Examiner* — Nathan W Ha
(74) *Attorney, Agent, or Firm* — Finch & Maloney PLLC

(57) ABSTRACT

Techniques are disclosed for forming an integrated circuit including a capacitor having a multilayer dielectric stack. For example, the capacitor may be a metal-insulator-metal capacitor (MIMcap), where the stack of dielectric layers is used for the insulator or 'I' portion of the MIM structure. In some cases, the composite or multilayer stack for the insulator portion of the MIM structure may include a first oxide layer, a dielectric layer, a second oxide layer, and a high-k dielectric layer, as will be apparent in light of this disclosure. Further, the multilayer dielectric stack may include an additional high-k dielectric layer, for example. Use of such multilayer dielectric stacks can enable increases in capacitance density and/or breakdown voltage for a MIMcap device. Further, use of a multilayer dielectric stack can enable tuning of the breakdown and capacitance characteristics as desired. Other embodiments may be described and/or disclosed.

20 Claims, 7 Drawing Sheets

(56) References Cited

U.S. PATENT DOCUMENTS

| | | | | |
|---|---|---|---|---|
| 8,581,318 B1* | 11/2013 | Chen | H01L 28/60 | 257/306 |
| 9,224,799 B2* | 12/2015 | Barabash | H01L 29/66181 | |
| 2006/0134808 A1* | 6/2006 | Summerfelt | H01L 28/57 | 438/3 |
| 2006/0214210 A1* | 9/2006 | Itokawa | H01L 28/65 | 257/296 |
| 2007/0040196 A1* | 2/2007 | Matsuura | H01L 27/11502 | 257/295 |
| 2008/0054328 A1* | 3/2008 | Wang | H01L 27/11507 | 257/306 |
| 2008/0121962 A1* | 5/2008 | Forbes | H01L 21/02178 | 257/310 |
| 2008/0149922 A1 | 6/2008 | Lin et al. | | |
| 2008/0277704 A1* | 11/2008 | Kanaya | H01L 28/55 | 257/295 |
| 2009/0075400 A1* | 3/2009 | Tamura | H01L 27/11507 | 438/3 |
| 2012/0061800 A1* | 3/2012 | Hirota | H01L 27/10852 | 257/532 |
| 2012/0322221 A1* | 12/2012 | Chen | H01L 28/65 | 438/381 |
| 2013/0270676 A1 | 10/2013 | Lindert et al. | | |
| 2013/0285205 A1 | 10/2013 | Chen et al. | | |
| 2014/0077336 A1 | 3/2014 | Chiang et al. | | |
| 2014/0187015 A1 | 7/2014 | Rui et al. | | |
| 2014/0187016 A1* | 7/2014 | Malhotra | H01L 28/75 | 438/381 |
| 2015/0048483 A1* | 2/2015 | Kuo | H01L 28/65 | 257/532 |
| 2015/0228710 A1* | 8/2015 | Rui | H01L 28/40 | 438/396 |

OTHER PUBLICATIONS

International Preliminary Report on Patentability received for PCT Application No. PCT/US2016/040684, dated Jan. 10, 2019. 10 pages.

* cited by examiner

CAPACITOR INCLUDING MULTILAYER DIELECTRIC STACK

BACKGROUND

In the fields of wireless communication and power management, various components can be implemented using solid-state devices, including transistors and capacitors, for example. For instance, such solid-state devices can be formed on an integrated circuit and be used for radio frequency (RF) communication applications, such as for RF front end applications. The RF front end is a generic term for the circuitry between an antenna and a digital baseband system. For RF applications, metal-insulator-metal capacitors (MIMcaps) are used for passive components. For instance, MIMcaps can be used for impedance matching and impedance tuning, to name a few example applications. Generally, capacitors include two electrically conductive layers, referred to as electrodes, separated by an insulator or dielectric material. The insulator or dielectric portion of the capacitor can act to increase the capacitor's charge capacity, such as by storing energy by becoming polarized, for example. In the field of MIMcaps, and capacitors in general, two metrics are important: capacitance density and breakdown voltage. Capacitance density is defined as the ratio of electric charge on each conductor that can be achieved to the potential difference between them, for a given area, where higher capacitance densities are generally desired. Breakdown voltage is the minimum voltage that causes a portion of the insulator or dielectric within the MIMcap structure to become electrically conductive, which limits the maximum energy that can be effectively stored in the capacitor.

Integrated circuit (IC) fabrication primarily includes two portions: the front-end or front-end-of-line (FEOL) and the back-end or back-end-of-line (BEOL). The front-end or FEOL is the first portion of IC fabrication where individual semiconductor devices are formed, including all processes up to the formation of one or more metallization or interconnect layers. The back-end or BEOL, not to be confused with back-end chip fabrication, is the second portion of IC fabrication where the individual semiconductor devices get interconnected with metal wiring. BEOL may include any number of metallization layers, depending on the target application or end use.

Figure 1:
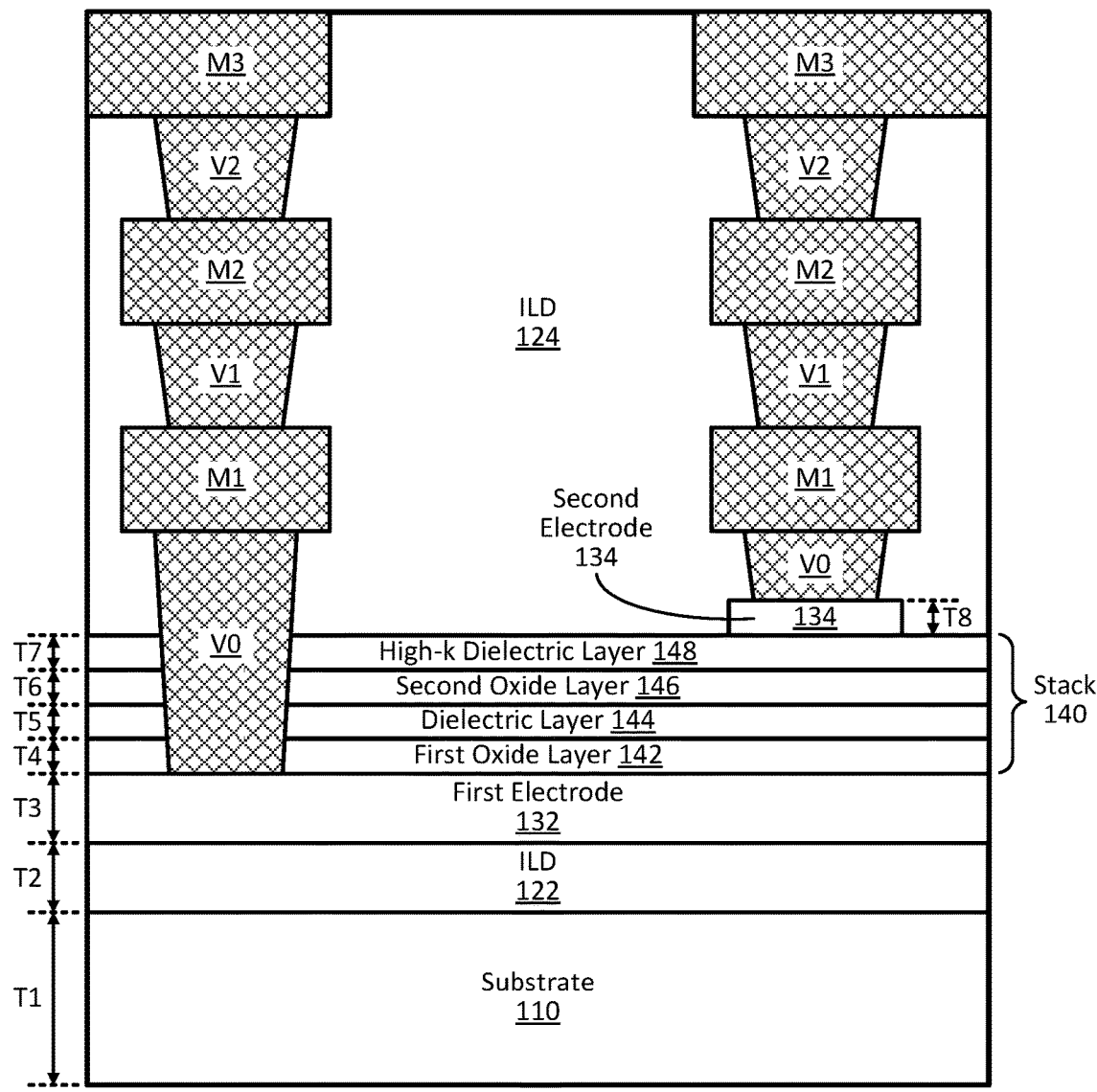
FIG. 1 illustrates an example integrated circuit (IC) structure including a metal-insulator-metal capacitor (MIMcap) having a multilayer dielectric stack for the insulator portion of the MIMcap, in accordance with some embodiments of the present disclosure. Note that the structure shown in FIG. 1 is a cross-sectional view taken along the layers of the MIMcap, as can be understood based on this disclosure.
Figure 1:
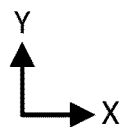

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

As previously described, metal-insulator-metal capacitors (MIMcaps) are used for RF applications. In the RF frontend, a MIMcap must withstand large voltages as a result of the large voltage swings produced by the RF power amplifier and mismatch with antenna impedance, which creates voltage standing waves along the RF path. For MIMcaps, high capacitance density is desired to minimize the area consumed by the MIMcap devices, allowing for smaller form factors. However, there is typically a trade-off between capacitance density and breakdown voltage for MIMcaps. For example, using hafnium oxide (HfO2) as the insulator in the MIM structure can provide relatively good capacitance density, such as capacitance density of greater than 1 femtofarad per square micron ($fF/micron^2$), but it also provides poor breakdown voltages, such as breakdown voltages of 1-2 V or less. Conversely, using silicon nitride (SiN) or silicon dioxide ($SiO_2$) as the insulator in the MIM structure can provide relatively high breakdown voltages, such as greater than 10 V and up to 20 V, but they also provide poor capacitance density, such as approximately 1 $fF/micron^2$ or less.

Thus, and in accordance with one or more embodiments of the present disclosure, techniques are provided for forming a capacitor having a multilayer dielectric stack. For example, the capacitor may be a metal-insulator-metal capacitor (MIMcap) device. Typically, the insulator or 'I' portion of the MIM structure includes only one electrically insulating layer. As will be apparent in light of this disclosure, in some embodiments, a stack of dielectric layers can be used for the insulator or 'I' portion of the MIM structure in a MIMcap device. In some such embodiments, the composite or multilayer stack for the insulator portion of the MIM structure may include a first oxide layer, a dielectric layer, a second oxide layer, and a high-k dielectric layer, as will be apparent in light of this disclosure. Further, in some such embodiments, the multilayer dielectric stack may include an additional high-k dielectric layer, for example. In some embodiments, use of a composite or multilayer stack for the insulator portion of the MIM structure as variously described herein can enable increases in capacitance density and/or breakdown voltage for a MIMcap device. Further still, use of a composite or multilayer stack for the insulator portion of the MIM structure as variously described herein can enable a smaller footprint for MIMcap devices and improve scaling, due to being able to achieve improved performance characteristics for a given MIMcap device, thereby reducing the number of MIMcap devices needed for a given application. For example, if an application requires a certain capacitance density for a given breakdown voltage, MIMcap devices may be operatively coupled in series and/or parallel to achieve the required capacitance density. Thus, in such an application, the improvements in capacitance density of the composite insulator MIMcap devices described herein can reduce the number of MIMcap devices needed to achieve the required capacitance density, thereby reducing the IC footprint of the given configuration.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit structure including a capacitor, such as a MIMcap or metal-insulator-semiconductor capacitor (MIScap), including a composite or multilayer dielectric stack as variously described herein for the insulator portion of the capacitor. In some cases, the IC structures and capacitor devices variously described herein may be detected based on the benefits derived from their use, for example. In some embodiments, the techniques and structures described herein can increase the capacitance density by at least approximately two times at an equivalent breakdown voltage of 20V compared to a typical device, for example. Further, in some embodiments, the IC structures and capacitor devices described herein may enable a high capacitance density, such as greater than 2 fF/micron$^2$ (e.g., 2.5 fF/micron$^2$) at a breakdown voltage of greater than 15 V (e.g., at 20 V). Further still, in some embodiments, the capacitance density and breakdown voltage of the IC structures and capacitor devices described herein may be tuned based on desired characteristics, such as reducing breakdown voltage to 2.5 V to achieve a capacitance density of up to 12.5 fF/micron$^2$, for example. In addition, use of the techniques and structures described herein can enable increased scaling, as the structures may have a smaller IC footprint and may also enable a reduced number of capacitors needed for a given application (e.g., due to the relatively improved characteristics of each capacitor). Therefore, the capacitors variously described herein can be beneficial for small form factor devices and provide higher performance (e.g., lower losses and higher signal integrity) for numerous RF communication applications. Numerous variations and configurations will be apparent in light of this disclosure.

Architecture and Methodology

FIG. 1 illustrates an example integrated circuit (IC) structure including a metal-insulator-metal capacitor (MIMcap) having a dielectric stack for the insulator portion of the MIMcap, in accordance with some embodiments of the present disclosure. Note that the structure shown in FIG. 1 is a cross-sectional view taken along the layers of the MIMcap, as can be understood based on this disclosure. Although the techniques and structures are primarily described in the context of MIMcaps, the present disclosure is not to be so limited. For example, in some embodiments, the capacitor devices formed using the techniques described herein may be formed with the electrodes or metal (or 'M') portions of the MIMcap structure generally including any electrically conductive material, and this the present disclosure is not intended to be limited to just a metal or metal alloy material for the electrodes of the capacitor, as will be apparent in light of this disclosure. For instance, the techniques described herein can be used to form a metal-insulator-semiconductor (MIS) structure, such that one of the electrodes of the capacitor structure includes a heavily doped semiconductor layer. In some such embodiments, such a heavily doped semiconductor layer (e.g., including dopant concentration of at least 1E20 atoms per cubic cm) may behave more like a conductor, such as a metal, thereby making such heavily doped semiconductor layers suitable for the electrodes of the capacitors described herein.

As will be apparent in light of this disclosure, the MIMcap in the structure of FIG. 1 is formed at the front-end or front-end-of-line (FEOL) portion of the IC structure, as shown. In other words, it is formed at a typical device level below the first metallization layer M1, for example. However, the present disclosure is not intended to be so limited. For instance, in the example embodiments of FIGS. 4 and 5, the MIMcaps are formed at the back-end or back-end-of-line (BEOL) portion of the IC structure, as will be described in more detail herein. As will also be apparent in light of this disclosure, although the MIMcap structure in FIG. 1 includes a planar configuration, the present disclosure is not intended to be so limited. For instance, in the example embodiments of FIGS. 4 and 5, the MIMcaps have a non-planar configuration, as will also be described in more detail herein.

As shown in the example embodiment of FIG. 1, the MIMcap structure includes first electrode 132, dielectric stack 140, and second electrode 134 in a MIM structure, where the MIM structure is formed above substrate 110 with interlayer dielectric (ILD) layer 122 therebetween. In this example embodiment, multilayer dielectric stack 140 is between the first electrode 132 and second electrode 134, and dielectric stack includes first oxide layer 142, dielectric layer 144, second oxide layer 146, and high-k dielectric layer 148, as shown. As is also shown, the left interconnect stack, including vias V0, V1, and V2, as well as metallization layers M1, M2, and M3 is in direct contact with and electrically connected to first electrode 132, while the right interconnect stack (including the same layers as the left interconnect stack) is in direct contact with and electrically connected to second electrode 134, in this example embodiment. The layers of the example structure of FIG. 1 will be described in more detail in turn.

Substrate 110, in some embodiments, may include: a bulk substrate including a group IV material, such as silicon (Si), germanium (Ge), SiGe, or silicon carbide (SiC), and/or at least one group III-V material and/or sapphire and/or any other suitable material(s) as will be apparent in light of this disclosure; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or sapphire). Note that group IV material as used herein includes at least one group IV element (e.g., carbon, silicon, germanium, tin, lead), such as Si, Ge, SiGe, or SiC to name some examples. Note that group III-V material as used herein includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. In some embodiments, substrate 110 may include a surface crystalline orientation described by a Miller Index of <100>, <110>, or <111>, or its equivalents, as will be apparent in light of this disclosure. Although substrate 110, in this example embodiment, is shown as having a thickness T1 (dimension in the Y direction) similar to the other layers for ease of illustration, in some instances, substrate 110 may be much thicker than the other layers, such as having a thickness in the range of 50 to 950 microns, for example. In some embodiments, substrate 110 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the structures described herein may be included in a system-on-chip (SoC) application, as will be apparent in light of this disclosure.

Interlayer dielectric (ILD) layer 122, in some embodiments, may be included to help electrically insulate or isolate overlying layers from substrate 110, for example. In some embodiments, ILD layer 122 may be formed using any suitable techniques, such as depositing the ILD 122 material on substrate 110 via molecular-beam epitaxy (MBE), chemical vapor deposition (CVD), atomic layer deposition (ALD), physical vapor deposition (PVD), and/or any other suitable process as will be apparent in light of this disclosure. In some embodiments, ILD layer 122 may be blanket deposited on substrate 110 or it may be selectively formed in desired locations, for example. In some embodiments, ILD layer 122 may include any suitable material, such as dielectric material, oxide material (e.g., silicon oxide), nitride material (e.g., silicon nitride), and/or carbide material (e.g., silicon carbide), for example. Note that in some embodiments, ILD layer 122 need not be present, such as in embodiments where substrate 110 is used as a bottom or first electrode for a capacitor structure including a multilayer dielectric stack, for example. In some such embodiments, at least the portion of substrate 110 intended to be used as the bottom or first electrode may be heavily doped (e.g., with doping concentrations greater than 1E20) to effectively enable that portion to operate as a capacitor electrode. In some embodiments, ILD layer 122 may have any suitable thickness T2 (dimension in the Y direction), such as a thickness in the range of 10 to 500 nm (e.g., 50 to 300 nm), or any other suitable range, as will be apparent in light of this disclosure.

First electrode layer 132, in some embodiments, may be formed using any suitable techniques, such as depositing the first electrode 132 material using one of the aforementioned processes (e.g., MBE, CVD, ALD, PVD), and/or any other suitable process as will be apparent in light of this disclosure. In some embodiments, first electrode layer 132 may be blanket deposited on ILD layer 122 or it may be selectively formed in desired locations above substrate 110, for example. In some embodiments, first electrode layer 132 may include any suitable electrically conductive material, such as a metal or metal alloy material including, e.g., titanium nitride (TiN), tantalum nitride (TaN), titanium aluminum nitride (TiAlN), aluminum (Al), tungsten (W), nickel (Ni), and/or platinum (Pt), just to name a few examples. In some embodiments, first electrode layer 132 may include semiconductor material, such as a group IV material (e.g., Si, SiGe, Ge) and/or group III-V material (e.g., GaAs, InGaAs, InGaN), that is heavily doped such that the layer behaves more like a conductor than a semiconductor. In some such embodiments, heavily doping the semiconductor material may include forming impurity dopants (e.g., of either a suitable n-type or p-type) in the material in concentrations of at least 1E18, 1E19, 1E20, or 1E21 atoms per cubic cm, or any other suitable minimum threshold dopant amount as will be apparent in light of this disclosure. In some embodiments, first electrode 134 may include a multilayer structure including two or more material layers, for example. In some embodiments, first electrode 132 may be referred to as a bottom electrode, due to its relative position in the IC structure of FIG. 1, for example. Note, as previously described, in some embodiments, first electrode layer 132 need not be present, such as in embodiments where substrate 110 is used as the first or bottom electrode, for example. In any such embodiments, the final capacitor structure (e.g., MIMcap structure) can include a first electrically conductive layer, which can be used as the first electrode. In some embodiments, first electrode layer 132 may have any suitable thickness T3 (dimension in the Y direction), such as a thickness in the range of 10 to 500 nm (e.g., 50 to 300 nm), or any other suitable range, as will be apparent in light of this disclosure.

Dielectric stack 140, which is a multilayer or composite stack, as previously described, may be formed using any suitable techniques, such as depositing the material layers (142, 144, 146, 148) using one of the aforementioned processes (e.g., MBE, CVD, ALD, PVD), and/or any other suitable process as will be apparent in light of this disclosure. In some embodiments, the layers of dielectric stack 140 may be blanket deposited or they may be selectively formed in desired locations above substrate 110, or some combination thereof, for example. As previously described, dielectric stack 140 is a multilayer or composite stack including multiple dielectric layers. In this example embodiment, dielectric stack 140 includes first oxide layer 142, dielectric layer 144, second oxide layer 146, and high-k dielectric layer 148, where the layers are described as such for ease of reference, as can be understood based on this disclosure. In some embodiments, the multilayer dielectric stack included in the capacitor device (e.g., for the insulator portion of the MIM structure, for a MIMcap device) may include any number of dielectric layers (e.g., 2, 3, 4, 5, 6, 7, 8, and so forth), such that the dielectric stack may include less, more, and/or alternative layers than the example case of dielectric stack 140 in the IC structure of FIG. 1. For example, the IC structure of FIG. 2 includes dielectric stack 240 which includes 5 layers, as will be described in more detail herein. Note that, in some embodiments, the layers may be in any order in dielectric stack 140 and need not have the order shown (e.g., where the layers go from 142 to 144 to 146 to 148 from the bottom of the stack to the top). For instance, in some embodiments, the layers in dielectric stack 140 may go from 148 to 146 to 144 to 142, for example, or have any other suitable configuration. Therefore, the present disclosure is not intended to be limited to any specific configuration for the multilayer/composite dielectric stack, unless otherwise stated.

First oxide layer 142, in some embodiments, may include any suitable oxide material, such as aluminum oxide (AL2O3), to provide an example. In some embodiments, first oxide layer 142 may have any suitable thickness T4 (dimension in the Y direction), such as a thickness in the range of 1 to 50 nm (e.g., 2 to 22 nm), or any other suitable thickness as will be apparent in light of this disclosure. Dielectric layer 144, in some embodiments, may include any suitable dielectric material, such as aluminum fluoride (AlF3) or other fluoride materials, to provide some examples. In some embodiments, dielectric layer 144 may have any suitable thickness T5 (dimension in the Y direction), such as a thickness in the range of 0.5 to 5 nm (e.g., approximately 1 nm, such as 1 nm plus/minus 0.1, 0.2, 0.3, 0.4, or 0.5 nm), or any other suitable thickness as will be apparent in light of this disclosure. Second oxide layer 146, in some embodiments, may include any suitable oxide material, such as aluminum oxide (AL2O3), to provide an example. In some embodiments, second oxide layer may have any suitable thickness T6 (dimension in the Y direction), such as a thickness in the range of 1 to 50 nm (e.g., 1 to 20 nm or 1 to 4 nm), or any other suitable thickness as will be apparent in light of this disclosure.

High-k dielectric layer 148, in some embodiments, may include any suitable material, such as any suitable high-k dielectric material, where the dielectric constant (k) value of the material is greater than that of silicon dioxide (SiO2) (which has a k value of 3.9). In other words, high-k dielectric material includes any dielectric material that has a k value of greater than 3.9. In some embodiments, the high-k dielectric material may be selected to have a k value of greater than 5, 10, 15, 20, or 25, or some other suitable minimum threshold value, as will be apparent in light of this disclosure. Example high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to name some examples. For instance, in an example embodiment, high-k dielectric layer 148 may include hafnium oxide (HfO2), to provide an example. In some embodiments, high-k dielectric layer 148 may have any suitable thickness T7 (dimension in the Y direction), such as a thickness in the range of 1 to 20 nm (e.g., 4 to 6 nm), or any other suitable thickness as will be apparent in light of this disclosure. Note that for any of the dielectric stacks described herein (e.g., stack 140 or 240) the designation of any of the layers included in the stacks as an oxide layer, dielectric layer, or high-k dielectric layer does not preclude other layers from including such material, as such designations are used herein for ease of reference. Also note that high-k dielectric layer 148 may be referred to as second high-k dielectric layer 148 herein, such as with reference to the example structure of FIG. 2.

In some embodiments, the thicknesses of the layers of dielectric stack 140 may be adjusted based on desired characteristics of the resulting MIMcap device. In other words, the techniques and structures variously described herein enable the ability to tune the characteristics of the resulting capacitor device, such as the breakdown voltage and capacitance density, which are two characteristics that are typically inversely related (and thus a trade-off typically exists between the two characteristics). For instance, in one example embodiment, the thickness of first oxide layer 142 and/or second oxide layer 146 may be adjusted to affect the breakdown voltage and capacitance density of the resulting MIMcap. In such an example embodiment, increasing the thicknesses of one or both of the oxide layers 142, 146 may relatively increase the breakdown voltage of the resulting MIMcap, but also may relatively reduce the capacitance density. Conversely, in such an example embodiment, reducing the thicknesses of the oxide layers 142, 146 may relatively decrease the breakdown voltage of the resulting MIMcap, but also may relatively increase the capacitance density. To provide a specific example, using thicknesses of 22/1/4/4 nm for layers 142/144/146/148 (and thus thicknesses T4/T5/T6/T7), the MIMcap device may be able to achieve a capacitance density of 2.5 fF/micron$^2$ at 20 V breakdown voltage, for instance. Adjusting the first oxide layer 142 thickness by reducing it to 2 nm (from 22 nm) and adjusting the second oxide layer 146 thickness by reducing it to 1 nm (from 4 nm), such that the dielectric stack includes thicknesses of 2/1/1/4 for layers 142/144/146/148, the MIMcap device may be able to achieve a capacitance density of 12.5 fF/micron$^2$ at a breakdown voltage of 2.5V. Note that the thicknesses variously described herein for each layer (e.g., for the electrodes and dielectric stack layers) may be the average thicknesses of the layer, the maximum thickness of the layer, and/or the minimum thickness of the layer, for example. Further note that, in some instances, such thicknesses may be measured in relevant locations (e.g., the layers of dielectric stack 140 may have a relevant location that is between the first electrode 132 and second electrode 134, the first and second electrodes 132, 134 may have relevant locations on either side of the dielectric stack 140, and so forth).

Second electrode layer 134, in some embodiments, may be formed using any suitable techniques, such as depositing the second electrode 134 material using one of the aforementioned processes (e.g., MBE, CVD, ALD, PVD), and/or any other suitable process as will be apparent in light of this disclosure. In some embodiments, second electrode 134 may be blanket deposited and patterned to the width (dimension in the X direction) shown in FIG. 1, to allow for subsequent interconnection to the MIM structure, or second electrode 134 may be selectively formed in only the location shown, as can be understood based on this disclosure. In some embodiments, second electrode 134 may be formed in the trench or recess used to form via V0 on the right side, where the second electrode 134 material is formed in the trench or recess prior to forming via V0. In some embodiments, via V0 and second electrode 134 may be the same feature, such that there is no distinct second electrode 134 and via V0 is instead used as the second electrode, as can be understood based on this disclosure. In some embodiments, second electrode layer 134 may include any suitable electrically conductive material, such as a metal or metal alloy material including, e.g., titanium nitride (TiN), tantalum nitride (TaN), titanium aluminum nitride (TiAlN), aluminum (Al), tungsten (W), nickel (Ni), and/or platinum (Pt), just to name a few examples. In some embodiments, second electrode layer 134 may include semiconductor material, such as a group IV material (e.g., Si, SiGe, Ge) and/or group III-V material (e.g., GaAs, InGaAs, InGaN), that is heavily doped such that the layer behaves more like a conductor than a semiconductor. In some such embodiments, heavily doping the semiconductor material may include forming impurity dopants (e.g., of either a suitable n-type or p-type) in the material in concentrations of at least 1E18, 1E19, 1E20, or 1E21 atoms per cubic cm, or any other suitable minimum threshold dopant amount as will be apparent in light of this disclosure. In some embodiments, second electrode 134 may include a multilayer structure including two or more material layers, for example. In some embodiments, second electrode 134 may be referred to herein as a top electrode, due to its relative position in the IC structure of FIG. 1, for example. In some embodiments, second electrode layer 134 may have any suitable thickness T8 (dimension in the Y direction), such as a thickness in the range of 10 to 500 nm (e.g., 50 to 300 nm), or any other suitable range, as will be apparent in light of this disclosure.

In the example embodiment of FIG. 1, formation of the IC structure can continue by depositing ILD 124 material and performing back-end or BEOL processing to complete the structure as shown. For instance, ILD 124 material may be deposited in a layer-by-layer manner, such that each via (V0, V1, V2) and metallization layer (M1, M2, M3) is formed after forming an ILD 124 layer, for example. Accordingly, although ILD 124 is shown as one continues feature in FIG. 1, the present disclosure is not intended to be so limited. Further, as previously described, second electrode may be formed after depositing at least a portion of ILD 124, as can be understood based on this disclosure. In some embodiments, the formation of ILD 124 may include any suitable techniques, such as depositing the ILD 124 material using one of the aforementioned processes (e.g., MBE, CVD, ALD, PVD), and/or any other suitable process as will be apparent in light of this disclosure. The back-end processing may also include forming the vias (V0, V1, V2) and metallization layers (M1, M2, M3) using any suitable techniques, such as etching a portion of ILD 124 and depositing the metal or otherwise electrically conductive material in the etched regions to form the structure shown, for example. Note that the vias V0, V1, V2 and metallization layers M1, M2, M3 include crosshatch patterning in the figures for illustrative purposes only and such patterning is not intended to limit the present disclosure in any way.

In some embodiments, ILD 124 may include any suitable material, such as dielectric material, oxide material (e.g., silicon oxide), nitride material (e.g., silicon nitride), and/or carbide material (e.g., silicon carbide), for example. In some embodiments, vias V0, V1, V2, V3 and metallization features/layers M1, M2, M3 may include any suitable electrically conductive material, such as copper (Cu), cobalt (Co), molybdenum (Mo), rhodium (Rh), beryllium (Be), chromium (Cr), manganese (Mn), aluminum (Al), silver (Ag), gold (Au), titanium (Ti), indium (In), ruthenium (Ru), palladium (Pd), tungsten (W), nickel (Ni), and/or graphene to name a few examples. As can be understood based on FIG. 1, the left vias and metallization layers (which may also be referred to as interconnect features) are in contact with and electrically connected to first electrode 132, in this example embodiment. Accordingly, it can be seen in FIG. 1 that via V0 was formed through dielectric stack 140, in this example embodiment, to make contact to first electrode layer 132. Further, the right vias and metallization layers (which may also be referred to as interconnect features) are in contact with and electrically connected to second electrode 134, in this example embodiment. Note that although three metallization layers are shown in the example IC of FIG. 1, but the present disclosure is not intended to be so limited.

Figure 2:
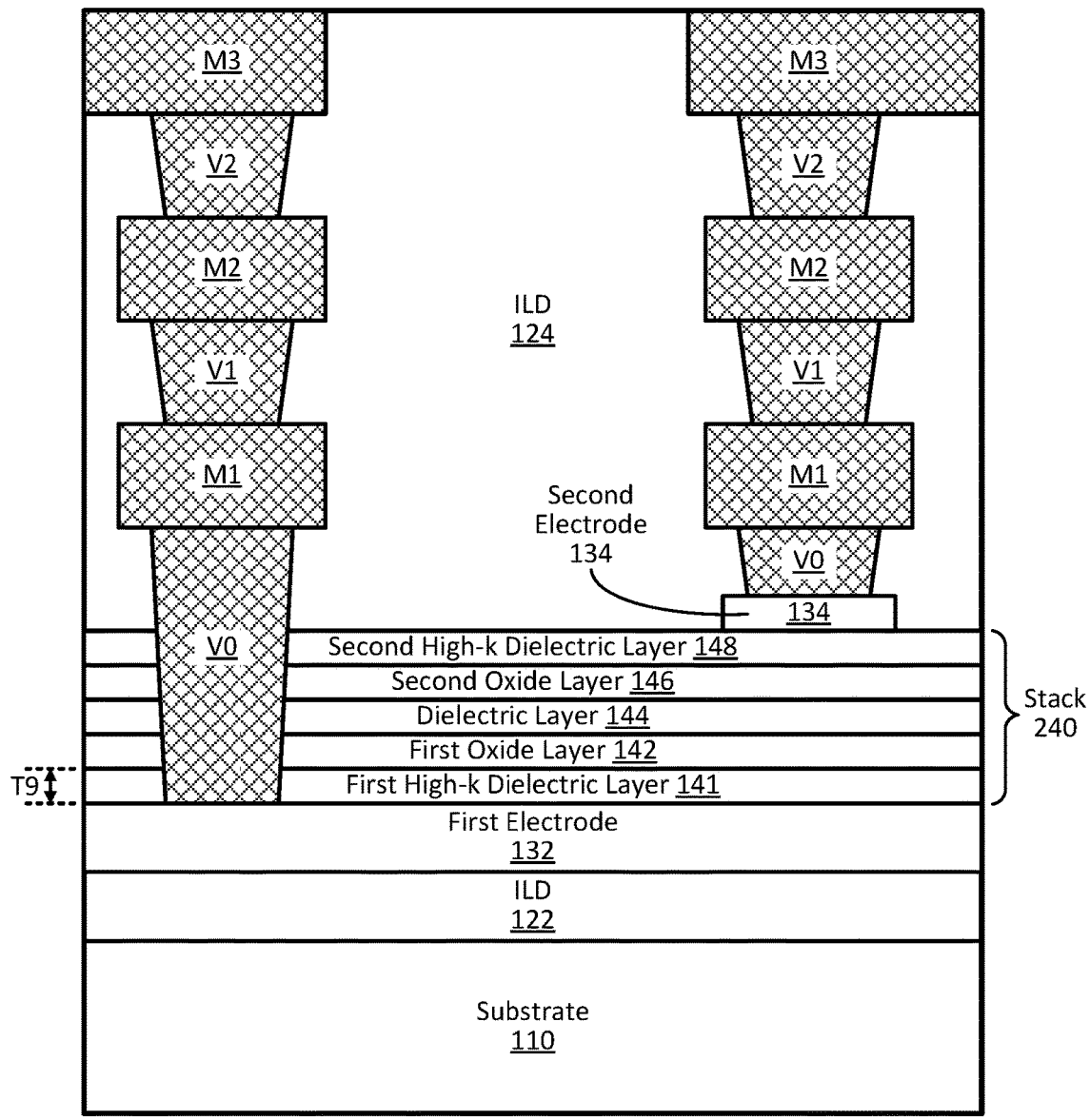
FIG. 2 illustrates the example IC structure of FIG. 1, including an additional layer in the dielectric stack, in accordance with an embodiment of the present disclosure.

FIG. 2 illustrates the example IC structure of FIG. 1, including an additional layer in the dielectric stack, in accordance with an embodiment of the present disclosure. The previous relevant description of the example IC structure of FIG. 1 is equally applicable to the example IC structure of FIG. 2. The primary difference between the two IC structures is that the structure of FIG. 2 includes a dielectric stack 240 (to coincide with stack 140) that includes an additional layer compared to dielectric stack 140. The additional layer is first high-k dielectric layer 141, and thus, high-k dielectric layer 148 has been designated second high-k dielectric layer 148 in FIG. 2 to assist with referring to the two layers. As shown in FIG. 2, first high-k dielectric layer 141 was formed prior to forming the other overlying layers in the dielectric stack 240, in this example embodiment. In some embodiments, first high-k dielectric layer 141 may be formed using any suitable techniques, such as depositing the layer 141 material using one of the aforementioned processes (e.g., MBE, CVD, ALD, PVD), and/or any other suitable process as will be apparent in light of this disclosure. In some embodiments, first high-k dielectric layer 141 may be blanket deposited on ILD layer 122 or it may be selectively formed in desired locations above substrate 110, for example.

First high-k dielectric layer 141, in some embodiments, may include any suitable material, such as any suitable high-k dielectric material, where the dielectric constant (k) value of the material is greater than that of silicon dioxide (SiO2) (which has a k value of 3.9). In other words, high-k dielectric material includes any dielectric material that has a k value of greater than 3.9. In some embodiments, the high-k dielectric material may be selected to have a k value of greater than 5, 10, 15, 20, or 25, or some other suitable minimum threshold value, as will be apparent in light of this disclosure. Example high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to name some examples. For instance, in an example embodiment, first high-k dielectric layer 141 may include hafnium oxide (HfO2), to provide an example. In some embodiments, first high-k dielectric layer 141 may have any suitable thickness T9 (dimension in the Y direction), such as a thickness in the range of 1 to 20 nm (e.g., 4 to 6 nm), or any other suitable thickness as will be apparent in light of this disclosure.

In some embodiments, dielectric stack 240 may include a substantially symmetrical configuration of material and/or thicknesses of the layers, such that layers 141 and 148 have substantially similar materials and/or thicknesses and layers 142 and 146 have substantially similar materials and/or thicknesses, with layer 144 being the middle layer of the stack 240. In some such embodiments, substantially similar materials may include that the two materials are greater than 85, 90, or 95 percent the same in composition, or some other suitable minimum threshold amount as will be apparent in light of the present disclosure. Further, in some such embodiments, substantially similar thicknesses may include thicknesses that have average, maximum, and/or minimum thicknesses that are within 0.2, 0.5, 1, 2, or 5 nm of each other, or some other suitable amount as will be apparent in light of the present disclosure. Such a symmetrical configuration for dielectric stack 240 may be selected for electrical linearity purposes, for example, which may improve the capacitor performance. Note that in some embodiments, the layers of the multilayer dielectric stacks described herein may be referred to using numbers to identify the layers, such as a first layer, second layer, and so forth. For instance, in some embodiments, layer 142 may be referred to as a first layer of the stack, layer 144 may be referred to as a second layer, layer 146 may be referred to as a third layer, layer 146 may be referred to as a fourth layer, and layer 141 may be referred to as a fifth layer, to provide an example.

Figure 3:
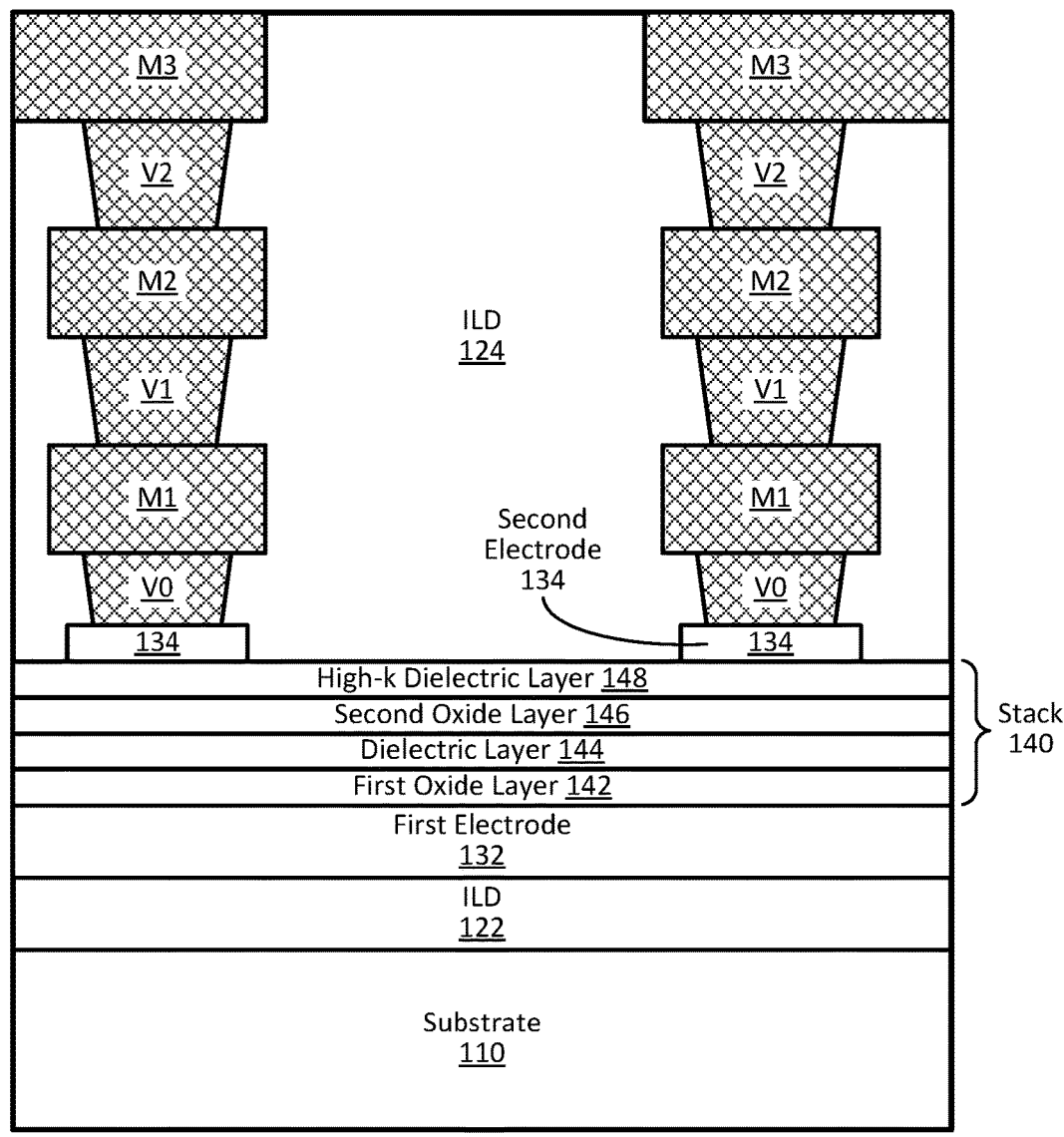
FIG. 3 illustrates the example IC structure of FIG. 1, including two capacitors in parallel, in accordance with an embodiment of the present disclosure.

FIG. 3 illustrates the example IC structure of FIG. 1, including two capacitors in parallel, in accordance with an embodiment of the present disclosure. The previous relevant description of the example IC structure of FIG. 1 is equally applicable to the example IC structure of FIG. 3. The primary difference is that the left interconnect stack is electrically connected to the second electrode layer 134, as the second electrode 134 was formed and is present in that location to place two capacitors in parallel, in this example embodiment. As can be understood based on this disclosure, the first electrode 134 may be connected elsewhere on the IC (not shown) using any suitable technique. In some embodiments, capacitors may be placed in parallel using an IC structure such as is shown in FIG. 3 (or any other suitable IC structure, as will be apparent in light of this disclosure) to increase breakdown voltage, for example. For instance, placing two capacitors in parallel, such as is shown in the example IC structure of FIG. 3, can increase breakdown voltage by approximately two times, placing three in parallel can increase breakdown voltage by approximately three times, and so forth. However, capacitance may be negatively affected for a given capacitor configuration when placing two or more such capacitors in parallel. For example, placing two capacitors in parallel, such as is shown in the example IC structure of FIG. 3, may reduce capacitance to one half, placing three in parallel may reduce capacitance to one third, and so forth. Thus, as can be understood based on this disclosure, placing capacitors in parallel may come with a breakdown voltage benefit but a capacitance (or capacitance density) detriment.

Figure 4:
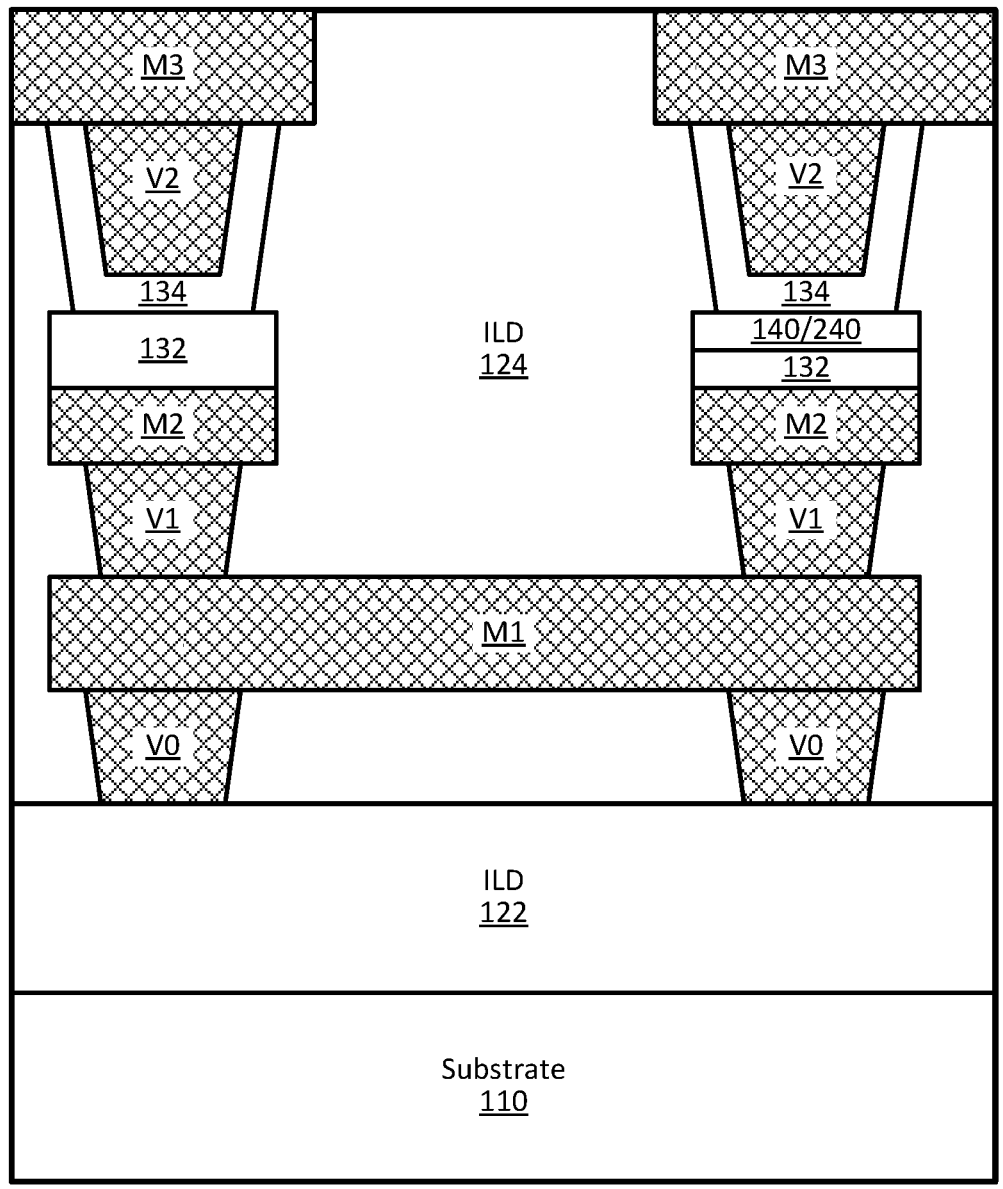
FIG. 4 illustrates an example IC structure including a back-end MIMcap having a multilayer dielectric stack for the insulator portion of the MIMcap, in accordance with some embodiments of the present disclosure.

FIG. 4 illustrates an example IC structure including a back-end MIMcap having a multilayer dielectric stack for the insulator portion of the MIMcap, in accordance with some embodiments of the present disclosure. The previous relevant description of the example IC structures of FIGS. 1, 2, and 3 are equally applicable to the example IC structure of FIG. 4. A primary difference between the IC structures of FIGS. 1 and 2 and the IC structure of FIG. 4 is that the example structure of FIG. 4 includes the capacitor device (e.g., MIMcap device) at the back-end or BEOL of the IC structure. In other words, first electrode 132, dielectric stack 140 or 240, and second electrode 134 were formed in the second metallization layer, between M2 and V2, as shown in this example embodiment. As a result, metallization layer M1 electrically connects the right and left interconnect stacks, as shown, to enable contact to first electrode 132, while second electrode 134 is still electrically connected through M3 of the right interconnect stack, for example. The structure of FIG. 4 can be formed using any suitable techniques, as will be apparent in light of this disclosure. For example, during formation of the second metallization layer (M2) and/or second via layer (V2), the MIMcap layers 132, 140/240, 134 can be formed using any suitable techniques, such as one or more of the aforementioned deposition processes (e.g., MBE, CVD, ALD, PVD), and/or any other suitable process as will be apparent in light of this disclosure. Note that although the MIMcap device is formed at the second metallization layer (M2) in this example embodiment, the present disclosure. For instance, formation of a MIMcap or capacitor device as variously described herein can be formed at any metallization layer of an IC structure, such as at M1, M2, M3, M4, and so forth, in some embodiments. Note that the multilayer dielectric stack in the example structure of FIG. 4 is designated as 140/240 to indicate that it may include a configuration similar to either of dielectric stack 140 or 240 as variously described herein.

Also note that the individual layers of the dielectric stack are not shown in FIG. 4 (as they are in FIGS. 1-3) for ease of illustration.

The example structure of FIG. 4 also illustrates that the MIMcap or capacitor devices variously described herein need not include a completely planar configuration. For instance, in some embodiments, one or more of the layers of the MIMcap device may be formed in a non-planar manner, such as how second electrode layer 134 was formed in the example structure of FIG. 4. As shown in FIG. 4, second electrode layer 134 has a substantially "U" or "V" shape; however, any suitable non-planar shape may be used in some embodiments, as will be apparent in light of this disclosure. In any such embodiments, a MIM structure can be formed where a multilayer dielectric stack is between two electrodes or electrically conductive layers (such as dielectric stack 140/240 between electrodes 132 and 124, in the example structure of FIG. 4). Use of a non-planar configuration for one or more of the layers of the MIMcap device variously described herein, in some embodiments, may be desired to minimize the IC footprint of the device and thereby help enable additional scaling. Further, in some embodiments, a non-planar configuration for one or more of the layers of the MIMcap device variously described herein may be used to enable formation of the device at certain portions of the IC, such as at back-end portions (e.g., as shown in FIG. 4), for example.

Figure 5:
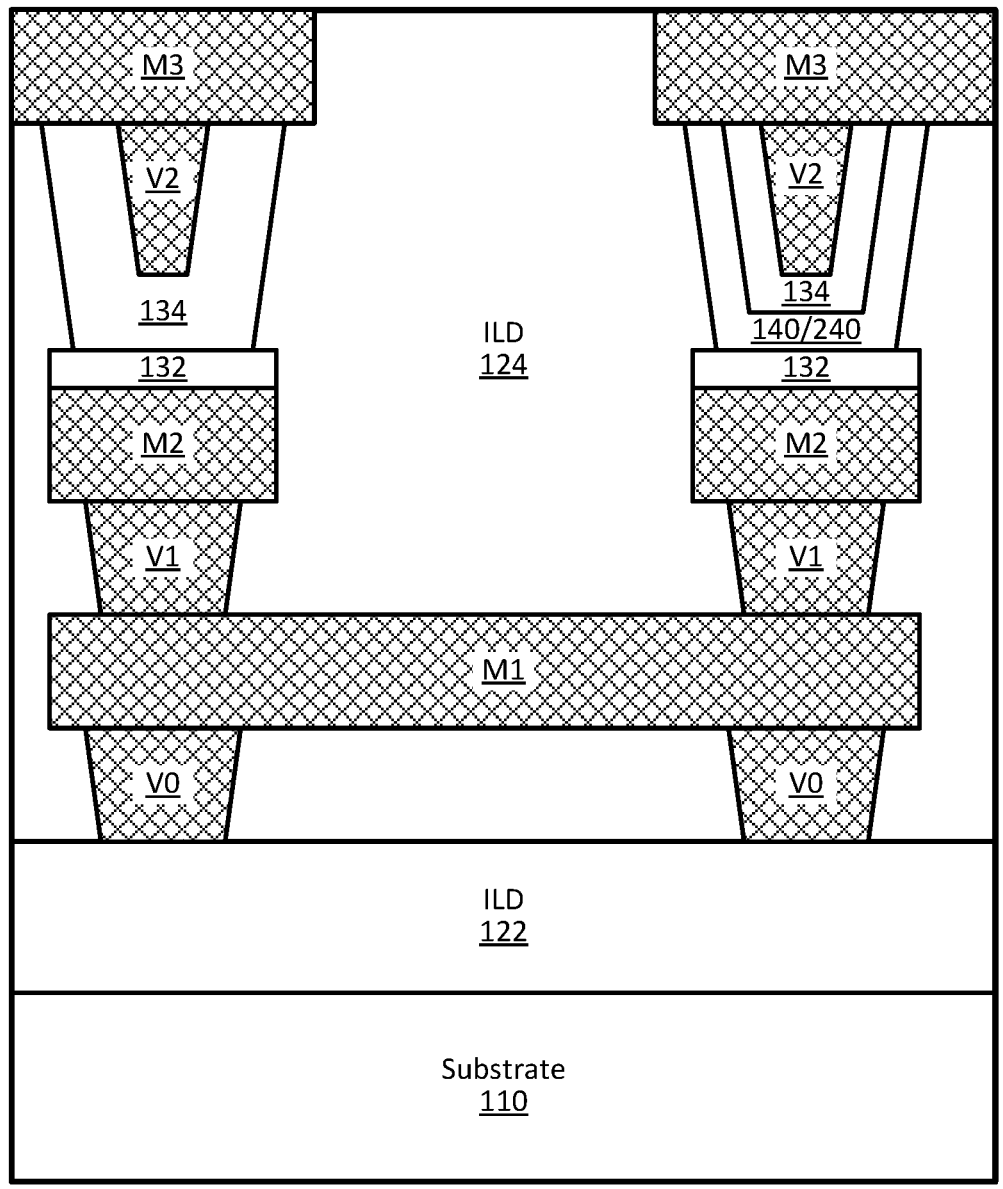
FIG. 5 illustrates the example structure of FIG. 4, including a non-planar dielectric stack, in accordance with an embodiment of the present disclosure.

FIG. 5 illustrates the example structure of FIG. 4, including a non-planar dielectric stack, in accordance with an embodiment of the present disclosure. The previous relevant description of the example IC structures of FIG. 4 is equally applicable to the example IC structure of FIG. 5. A primary difference between the two structures is that the dielectric stack 140/240 includes a non-planar configuration in the example IC structure of FIG. 5, as shown. As previously described, one or more of the layers of the MIMcap device variously described herein may be formed in a non-planar manner. As shown in FIG. 5, second electrode layer 134 and dielectric stack 140/240 both have a substantially "U" or "V" shape; however, any suitable non-planar shape may be used in some embodiments, as will be apparent in light of this disclosure.

Figure 6:
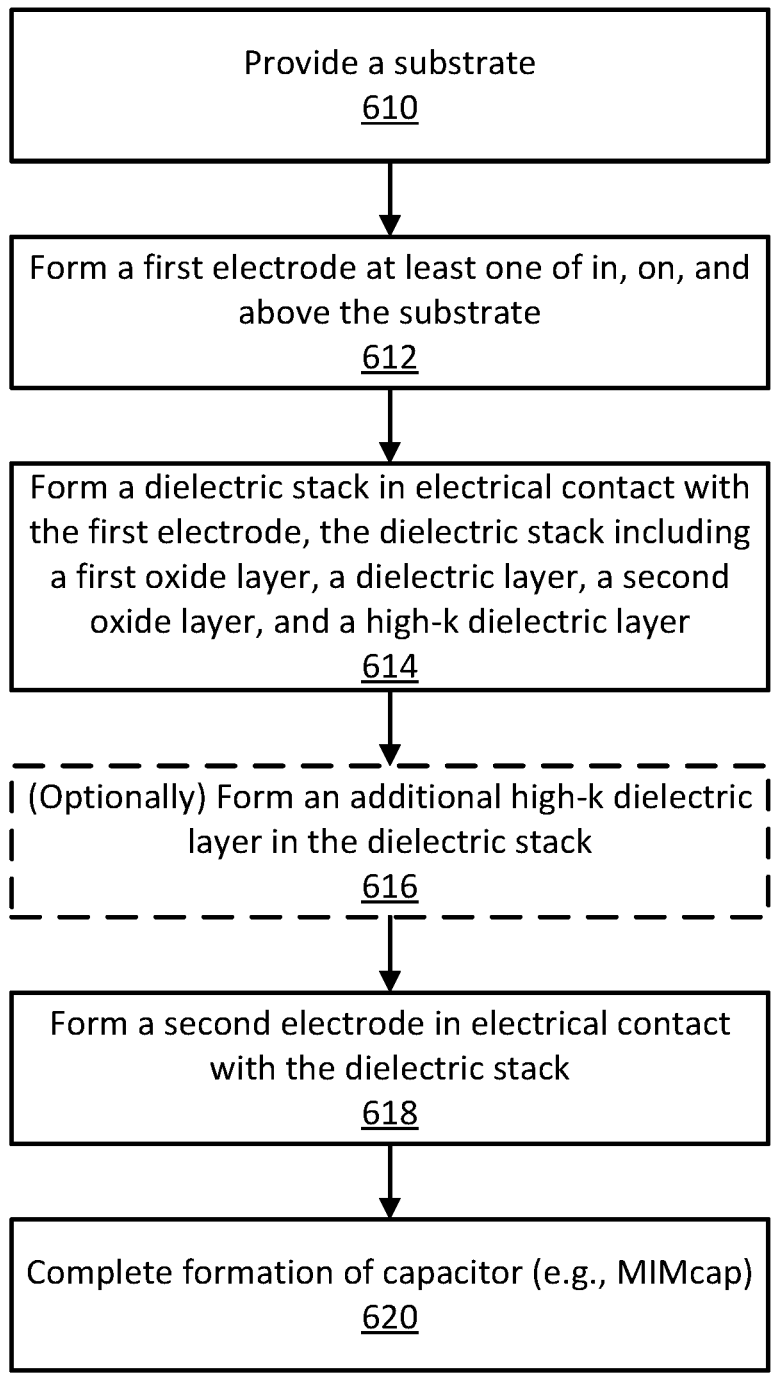
FIG. 6 illustrates an example method of forming an IC structure including a MIMcap having a multilayer dielectric stack, in accordance with some embodiments of the present disclosure.

FIG. 6 illustrates an example method 600 of forming an IC structure including a MIMcap having a multilayer dielectric stack, in accordance with some embodiments of the present disclosure. Example method 600 includes providing 610 a substrate, such as substrate 110 as variously described herein. For instance, in some embodiments, the substrate may be a S1 substrate, just to name an example. Example method 600 continues with forming 612 a first electrode or first electrically conductive layer at least one of in, on, and above the substrate. For instance, the first electrode may be first electrode 132 as variously described herein. In some embodiments, an ILD layer (e.g., ILD layer 122 as variously described herein) may be formed prior to forming the first electrode. Example method 600 continues with forming 614 a dielectric stack in electrical contact (e.g., in direct physical contact with) the first electrode. In this example embodiment, the dielectric stack includes the layers of dielectric stack 140 as variously described herein. In some embodiments, the dielectric stack may be formed on and/or above the first electrode, such as is the case with dielectric stack 140 in FIG. 1, for example. Example method 600 continues with optionally forming 616 an additional high-k dielectric layer in the dielectric stack. For instance, in embodiments where such a process is performed, the dielectric stack may be similar to that of dielectric stack 240 as variously described herein, as can be understood. However, in some embodiments, such a formation process 616 need not be performed. Example method 600 continues with forming 618 a second electrode in electrical contact with the dielectric stack. For instance, the second electrode may be the second electrode 134 as variously described herein. In some embodiments, second electrode may be formed at least one of on and above the dielectric stack. Example method 600 continues with completing formation 620 of a capacitor device, such as a MIMcap device, which can be performed using any suitable techniques and structures as can be understood based on this disclosure. Numerous variations and configurations will be apparent in light of this disclosure.

Example System

Figure 7:
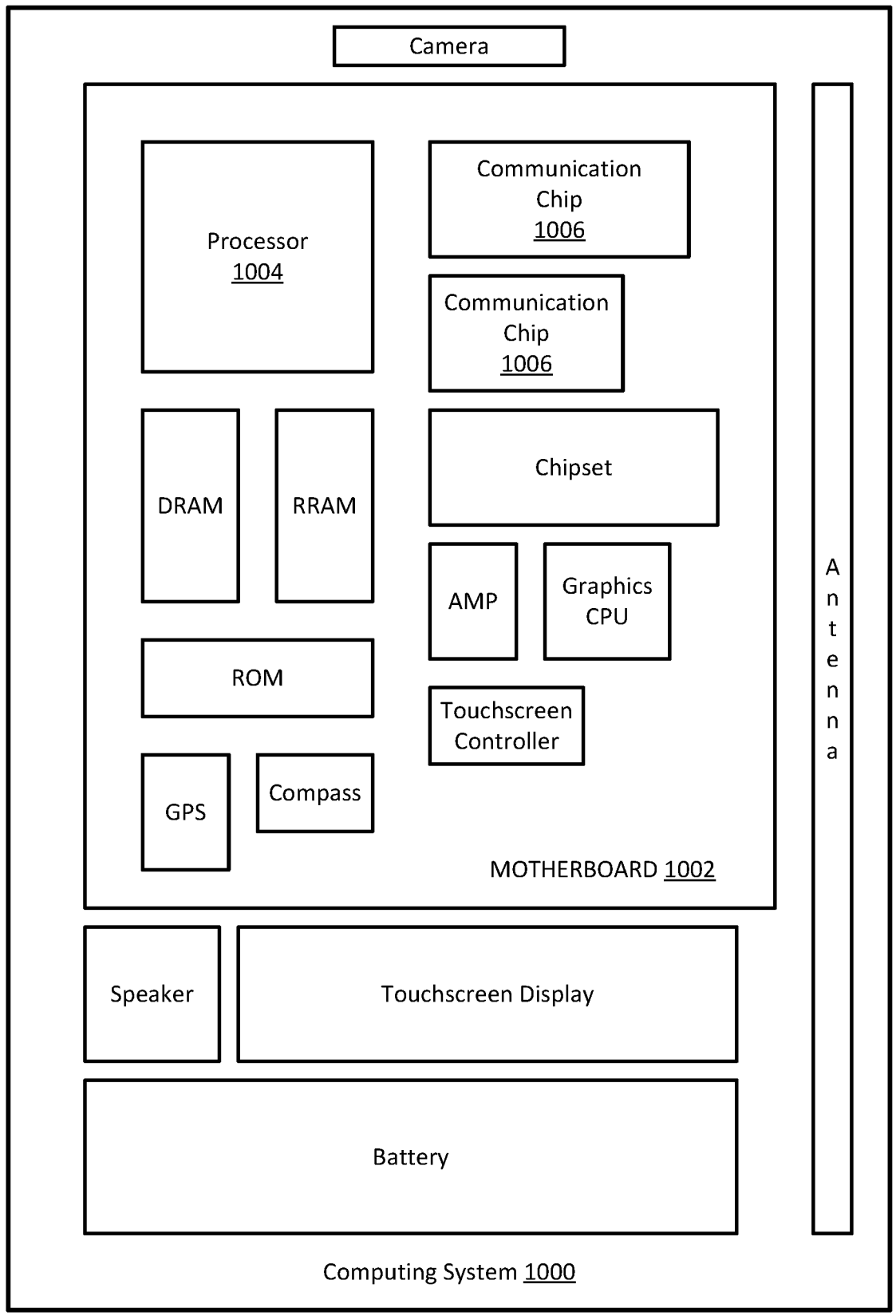
FIG. 7 illustrates a computing system implemented with the integrated circuit structures and/or techniques disclosed herein, in accordance some embodiments of the present disclosure.

FIG. 7 illustrates a computing system 1000 implemented with the integrated circuit structures and/or techniques disclosed herein, in accordance some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM, RRAM, etc.), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., one or more RRAM cells) formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, any included communication chips 1006 or other included RF componentry may include one or more capacitors or MIMcaps as variously described herein.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., one or more RRAM cells) formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., one or more RRAM cells) formed using the disclosed techniques, as variously described herein.

FURTHER EXAMPLE EMBODIMENTS

The following examples pertain to further embodiments, from which numerous permutations and configurations will be apparent.

Example 1 is an integrated circuit (IC) including: a first electrically conductive layer; a second electrically conductive layer; and a stack of layers between the first and second electrically conductive layers. The stack of layers includes: a first layer including an oxide material; a second layer including a dielectric material; a third layer including an oxide material; and a fourth layer including a high-k dielectric material.

Example 2 includes the subject matter of Example 1, wherein at least one of the first and second electrically conductive layers includes one of a metal and a metal alloy.

Example 3 includes the subject matter of any of Examples 1-2, wherein at least one of the first and second electrically conductive layers includes heavily doped semiconductor material with doping concentrations of greater than 1E20 atoms per cubic cm.

Example 4 includes the subject matter of any of Examples 1-3, wherein at least one of the first and second electrically conductive layers includes one of titanium nitride (TiN), tantalum nitride (TaN), titanium aluminum nitride (TiAlN), tungsten (W), nickel (Ni), and platinum (Pt).

Example 5 includes the subject matter of any of Examples 1-4, wherein the first and second electrically conductive layers each have a thickness in a dimension of a major axis of the stack of layers in the range of 50 to 300 nm.

Example 6 includes the subject matter of any of Examples 1-5, wherein the first and third layers include aluminum oxide (Al2O3).

Example 7 includes the subject matter of any of Examples 1-6, wherein the first layer has a thickness between the first and second electrically conductive layers in the range of 1 to 50 nm.

Example 8 includes the subject matter of any of Examples 1-7, wherein the third layer has a thickness between the first and second electrically conductive layers in the range of 1 to 20 nm.

Example 9 includes the subject matter of any of Examples 1-8, wherein the second layer includes aluminum fluoride (AlF3).

Example 10 includes the subject matter of any of Examples 1-9, wherein the second layer has a thickness between the first and second electrically conductive layers in the range of 0.5 to 5 nm.

Example 11 includes the subject matter of any of Examples 1-10, wherein the fourth layer includes a high-k dielectric material having a dielectric constant (k) value of greater than 15.

Example 12 includes the subject matter of any of Examples 1-11, wherein the fourth layer includes hafnium oxide (HfO2).

Example 13 includes the subject matter of any of Examples 1-12, wherein the fourth layer has a thickness between the first and second electrically conductive layers in the range of 1 to 20 nm.

Example 14 includes the subject matter of any of Examples 1-13, wherein the first, second, third, and fourth layers are arranged in a corresponding order in the stack of layers.

Example 15 includes the subject matter of any of Examples 1-14, wherein the stack of layers further includes a fifth layer, the fifth layer including a high-k dielectric material.

Example 16 includes the subject matter of Example 15, wherein the fifth layer includes a high-k dielectric material having a dielectric constant (k) value of greater than 15.

Example 17 includes the subject matter of any of Examples 15-16, wherein the fifth layer has a thickness between the first and second electrically conductive layers in the range of 2 to 20 nm.

Example 18 includes the subject matter of any of Examples 15-16, wherein the fifth layer is between the first layer and one of the first and second electrically conductive layers.

Example 19 is a capacitor including the subject matter of any of Examples 1-18.

Example 20 is a computing system including the subject matter of any of Examples 1-19.

Example 21 includes an integrated circuit (IC) including: a first electrode; a second electrode; and a stack of layers between the first and second electrodes. The stack of layers includes: a first layer including aluminum oxide (Al2O3); a second layer including aluminum fluoride (AlF3); a third layer including aluminum oxide (Al2O3); and a fourth layer including a high-k dielectric material having a dielectric constant (k) value of greater than 15; wherein the first, second, third, and fourth layers are arranged in a corresponding order in the stack of layers.

Example 22 includes the subject matter of Example 21, wherein at least one of the first and second electrodes includes one of a metal and a metal alloy.

Example 23 includes the subject matter of any of Examples 21-22, wherein at least one of the first and second electrodes includes heavily doped semiconductor material with doping concentrations of greater than 1E20 atoms per cubic cm.

Example 24 includes the subject matter of any of Examples 21-23, wherein at least one of the first and second electrodes includes one of titanium nitride (TiN), tantalum nitride (TaN), titanium aluminum nitride (TiAlN), aluminum (Al), tungsten (W), nickel (Ni), and platinum (Pt).

Example 25 includes the subject matter of any of Examples 21-24, wherein the first and second electrodes each have a thickness in a dimension of a major axis of the stack of layers in the range of 100 to 200 nm.

Example 26 includes the subject matter of any of Examples 21-25, wherein the first layer has a thickness between the first and second electrodes in the range of 2 to 22 nm.

Example 27 includes the subject matter of any of Examples 21-26, wherein the second layer has a thickness between the first and second electrodes of approximately 1 nm.

Example 28 includes the subject matter of any of Examples 21-27, wherein the third layer has a thickness between the first and second electrodes in the range of 1 to 4 nm.

Example 29 includes the subject matter of any of Examples 21-28, wherein the fourth layer includes hafnium oxide (HfO2).

Example 30 includes the subject matter of any of Examples 21-29, wherein the fourth layer has a thickness between the first and second electrodes in the range of 4 to 6 nm.

Example 31 includes the subject matter of any of Examples 21-30, wherein the stack of layers further includes a fifth layer, the fifth layer including a high-k dielectric material having a dielectric constant (k) value of greater than 15.

Example 32 includes the subject matter of Example 31, wherein the fifth layer includes hafnium oxide (HfO2).

Example 33 includes the subject matter of any of Examples 31-32, wherein the fifth layer has a thickness between the first and second electrodes in the range of 1 to 4 nm.

Example 34 includes the subject matter of any of Examples 31-33, wherein the fifth layer is between the first layer and one of the first and second electrodes.

Example 35 includes the subject matter of any of Examples 21-34, wherein the stack of layers is located at a back-end portion of the integrated circuit, such that the stack of layers is above at least one metallization layer.

Example 36 is a capacitor including the subject matter of any of Examples 21-35.

Example 37 is a computing system including the subject matter of any of Examples 21-36.

Example 38 is a method of forming an integrated circuit (IC), the method including: forming a first electrically conductive layer; forming a first layer including an oxide material at least one of on and above the first electrically conductive layer; forming a second layer including a dielectric material on the first layer; forming a third layer including an oxide material on the second layer; forming a fourth layer including a high-k dielectric material on the third layer; and forming a second electrically conductive layer at least one on and above the fourth layer.

Example 39 includes the subject matter of Example 38, wherein the first layer is formed on the first electrically conductive layer.

Example 40 includes the subject matter of Example 38, further including forming a fifth layer between the first electrically conductive layer and the first layer, the fifth layer including a high-k dielectric material.

Example 41 includes the subject matter of any of Examples 38-40, further including forming an interlayer dielectric (ILD) layer between the first electrically conductive layer and a substrate.

Example 42 includes the subject matter of any of Examples 38-41, wherein the first and third layers include aluminum oxide (Al2O3).

Example 43 includes the subject matter of any of Examples 38-42, wherein the second layer includes aluminum fluoride (AlF3).

Example 44 includes the subject matter of any of Examples 38-43, wherein the fourth layer includes hafnium oxide (HfO2).

Example 45 includes the subject matter of any of Examples 38-44, wherein the second electrically conductive layer is formed on the fourth layer.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) comprising:
   a first layer comprising electrically conductive material;
   a second layer comprising electrically conductive material; and
   a stack of layers between the first and second layers, the stack of layers including
      a third layer including an oxide material,
      a fourth layer including a dielectric material different from the oxide material,
      a fifth layer including an oxide material different from the dielectric material, and
      a sixth layer including a high-k dielectric material different from the oxide and the dielectric materials, wherein the high-k dielectric material of the sixth layer has a first dielectric constant, and the dielectric material of the fourth layer has a second dielectric constant different from the first dielectric constant.

2. The IC of claim 1, wherein the first and second layers includes one or both of a metal and a metal alloy.

3. The IC of claim 1, wherein one or both of the first and second layers includes heavily doped semiconductor material with doping concentrations of greater than 1E20 atoms per cubic cm.

4. The IC of claim 1, wherein one or both of the first and second layers includes one or more titanium, tantalum, aluminum, nitrogen, tungsten, nickel, and platinum.

5. The IC of claim 1, wherein the first and second layers each have a thickness in a dimension of a major axis of the stack of layers in the range of 50 to 300 nm.

6. The IC of claim 1, wherein the third and fifth layers include aluminum and oxygen.

7. The IC of claim 1, wherein the third layer has a thickness between the first and second layers in the range of 2 to 22 nm, and wherein the fifth layer has a thickness between the first and second layers in the range of 1 to 4 nm.

8. The IC of claim 1, wherein the fourth layer includes aluminum and fluorine, and has a thickness between the first and second layers in the range of 0.5 to 1.5 nm.

9. The IC of claim 1, wherein the sixth layer includes the high-k dielectric material having a dielectric constant (k) value of greater than 15.

10. The IC of claim 1, wherein the sixth layer includes hafnium and oxygen.

11. The IC of claim 1, wherein the sixth layer has a thickness between the first and second layers in the range of 4 to 6 nm.

12. The IC of claim 1, wherein the third, fourth, fifth, and sixth layers are arranged in a corresponding order in the stack of layers.

13. The IC of claim 1, wherein the stack of layers further includes a seventh layer, the seventh layer including a high-k dielectric material.

14. The IC of claim 13, wherein the seventh layer is between the third layer and one of the first and second layers, includes a high-k dielectric material having a dielectric constant (k) value of greater than 15, and has a thickness between the first and second layers in the range of 2 to 20 nm.

15. A capacitor comprising the IC of claim 1.

16. An integrated circuit (IC) comprising:
   a first electrode;
   a second electrode; and
   a stack of layers between the first and second electrodes, the stack of layers including
      a first layer including aluminum and oxygen,
      a second layer including aluminum and fluorine,
      a third layer including aluminum and oxygen, and
      a fourth layer including a high-k dielectric material having a dielectric constant (k) value of greater than 10;
   wherein the first, second, third, and fourth layers are arranged in a corresponding order in the stack of layers.

17. The IC of claim 16, wherein the stack of layers further includes a fifth layer, the fifth layer including a high-k dielectric material having a dielectric constant (k) value of greater than 15.

18. The IC of claim 16, wherein the stack of layers is located at a back-end portion of the integrated circuit, such that the stack of layers is above at least one metallization layer.

19. An integrated circuit (IC) comprising:
   a first layer directly coupled to a first interconnect structure;
   a second layer directly coupled to a second interconnect structure;
   a third layer between the first and second layers, the third layer including aluminum and oxygen;
   a fourth layer between the third and second layers, the fourth layer including aluminum and fluorine;
   a fifth layer between the fourth and second layers, the fifth layer including aluminum and oxygen; and
   a sixth layer between the fifth and second layers, the sixth layer including a high-k dielectric material.

20. The IC of claim 19, wherein the second interconnect structure extends through one or more of the third, fourth, fifth, and sixth layers.

* * * * *